(12) United States Patent
Plewe et al.

(10) Patent No.: US 10,176,681 B2
(45) Date of Patent: Jan. 8, 2019

(54) HAPTIC FEEDBACK IN A USER INTERFACE

(71) Applicant: DAIMLER AG, Stuttgart (DE)

(72) Inventors: Marco Plewe, Sunnyvale, CA (US); Sarah Plewe, Sunnyvale, CA (US); Jörg Reisinger, Löchgau (DE)

(73) Assignee: DAIMLER AG, Stuttgart (DE)

( * ) Notice: Subject to any disclaimer, the term of this patent is extended or adjusted under 35 U.S.C. 154(b) by 0 days.

(21) Appl. No.: 16/061,235

(22) PCT Filed: Nov. 21, 2016

(86) PCT No.: PCT/EP2016/001959
§ 371 (c)(1),
(2) Date: Jun. 11, 2018

(87) PCT Pub. No.: WO2017/097399
PCT Pub. Date: Jun. 15, 2017

(65) Prior Publication Data
US 2018/0357864 A1    Dec. 13, 2018

(30) Foreign Application Priority Data

Dec. 12, 2015  (DE) .................. 10 2015 016 152

(51) Int. Cl.
*G08B 6/00*    (2006.01)

(52) U.S. Cl.
CPC ........... *G08B 6/00* (2013.01); *H03K 2217/96* (2013.01); *H03K 2217/96062* (2013.01); *H03K 2217/96066* (2013.01)

(58) Field of Classification Search
CPC .. G06F 1/01; G06F 1/016; G06F 1/02; H03K 17/96; H03K 2217/96; H03K 2217/96062; H03K 2217/96066
See application file for complete search history.

(56) References Cited

U.S. PATENT DOCUMENTS 8,710,965 B2 *  4/2014  Li .................... G06F 3/016
                                                340/407.1
9,833,697 B2 * 12/2017  Grant ................. A63F 13/10
(Continued)

FOREIGN PATENT DOCUMENTS

AU      2015101188 A4    10/2015
DE   102009026408 A1     1/2010
(Continued)

OTHER PUBLICATIONS

Search Report created on Sep. 19, 2018 in related DE Application No. 10 2015 016 152.0 (reference EP 2518588 was previously cited in an IDS on Jun. 11, 2018).

(Continued)

*Primary Examiner* — Van T Trieu
(74) *Attorney, Agent, or Firm* — Patent Portfolio Builders PLLC

(57) ABSTRACT

An actuator is connected to an operating element of a manual user interface and outputs a haptic feedback signal to the user via the operating element. The operating element includes a sensor that detects a sensor signal generated by a manual input of the user as a reaction to the emitted feedback signal. The user's reaction time is determined. If the reaction time is shorter than a predetermined limit value, future haptic feedback signals are adjusted in such a way that their haptically perceptible intensity is reduced, and if the reaction time is greater than the predetermined limit value, future haptic feedback signals are changed in such a way that their haptically perceptible intensity is increased.

10 Claims, 2 Drawing Sheets

(56) References Cited

U.S. PATENT DOCUMENTS

Figure 1:
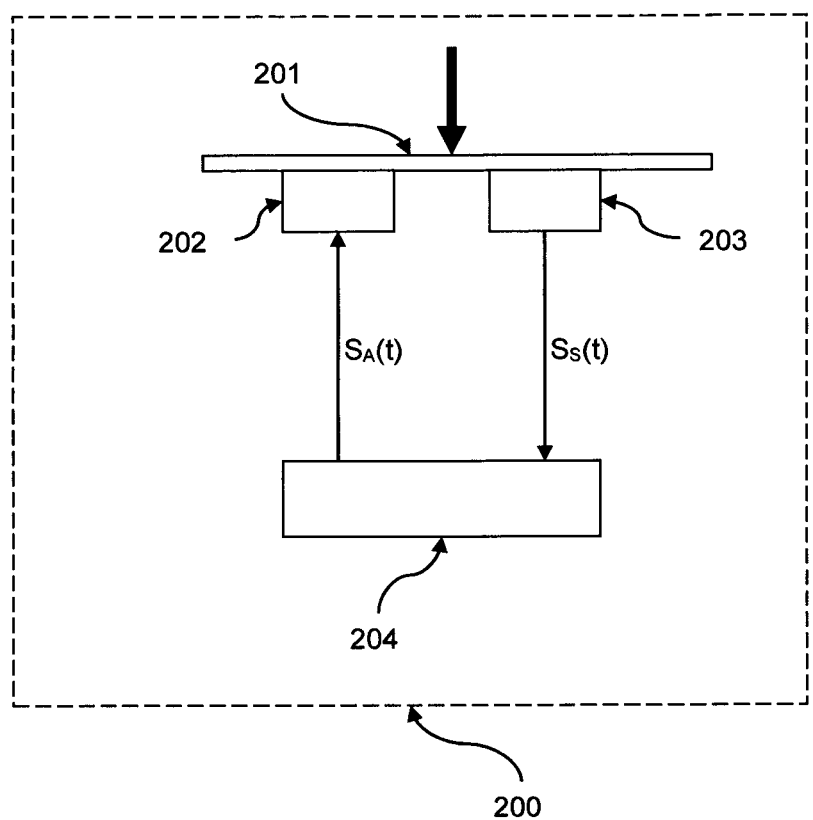

| | | | |
|---|---|---|---|
| 9,886,184 B2* | 2/2018 | Bernstein | G06F 3/016 |
| 9,904,365 B2* | 2/2018 | Son | G06F 3/016 |
| 2009/0295739 A1 | 12/2009 | Nagara | |
| 2016/0139670 A1* | 5/2016 | Levesque | G08B 6/00 |
| | | | 715/702 |
| 2016/0195931 A1 | 7/2016 | Czelnik et al. | |

FOREIGN PATENT DOCUMENTS

| | | |
|---|---|---|
| EP | 2117122 A1 | 11/2009 |
| EP | 2518588 A1 | 10/2012 |
| WO | 2007128633 A1 | 11/2007 |

OTHER PUBLICATIONS

International Search Report dated Feb. 6, 2017 in related International Application No. PCT/EP2016/001959.
Written Opinion dated Feb. 6, 2017 in related International Application No. PCT/EP2016/001959.

* cited by examiner

HAPTIC FEEDBACK IN A USER INTERFACE

BACKGROUND AND SUMMARY OF THE INVENTION

Exemplary embodiments of the invention relate to a method for controlling an actuator that is connected to an operating element of a manual user interface, and that serves for the output of a haptic feedback signal $S_A(t)$ to the user via the operating element. Furthermore, exemplary embodiments of the invention relate to a manual user interface comprising an operating element for the manual input by a user and an actuator connected to the operating element for the output of a haptic feedback signal $S_A(t)$ to the user via the operating element.

Exemplary embodiments of the invention are used with any manual user interfaces that are formed for the output of a haptic feedback signal, wherein the haptic feedback signal specifies, in particular, information about a current state of the manual user interface or the operating element. Here, the manual operating elements can be, for example, a button, a touch-sensitive surface, a switch, a computer mouse, a joystick, etc.

European patent document EP 2 117 122 A1 discloses an arrangement and a method for haptic and/or acoustic feedback to sensory operating elements. The arrangement for the feedback of the actuation to sensory operating elements comprises at least one carrier plate as the operating element, a sensor arranged on the carrier plate, at least one broadband electro-mechanic and/or electro-acoustic signal transducer, preferably a voice coil that is allocated to the at least one carrier plate, and a control unit electrically connected to the sensor and the voice coil and is set up to analyze the sensor signals emitted by the sensor and for the generation of at least one haptic and/or acoustic feedback signal.

The term "haptic user interface" is also used for such arrangements as are disclosed in EP 2 117 122 A1. Such "haptic user interfaces" enable a user to obtain tactile or kinetic feedback at the same time as manually actuating the operating element. This feedback allows the creation of an intuitive connection between the manual actuation of the operating element and the actions induced thereby. Furthermore, this feedback enables the user to be informed, for example, about a current state or mode of the operating element, without a display having to be observed. This is particularly advantageous when the operating element is arranged in a vehicle, in particular a motor vehicle, and controls motor vehicle systems, for example. During operation, the driver does not have to turn his/her attention away from the observation of the surrounding traffic situation and towards the operating element in order to obtain information about the current state of the haptic user interface or the operating element, but rather he/she obtains this information about the current state of the operating element via the haptic feedback. Thus, a user can recognize, by means of the emitted feedback, for example, when a switching process generated by an input into the operating element is carried out. In particular, feedback signals can be depicted that represent different pieces of information, for example a first feedback signal that represents a correctly recognized actuation of the operating element and a second feedback signal that represents an erroneous input in the event of the actuation of the operating element. In particular, the haptic impression in the event of the actuation of a button, for example, can thus be approximately simulated.

Furthermore, feedback signals can signalize the correctly recognized start of an actuation of the operating element and the correctly recognized end of an actuation of the operating element. This is always advantageous when it is an input of a time interval. In these cases, the output of a first feedback signal takes place advantageously as soon as the start of the actuation has been correctly recognized, and the output of a second feedback signal takes place as soon as the end of the actuation has been correctly recognized.

Embodiments of the invention are directed to an improved haptic user interface and a method for controlling such a haptic user feedback interface that takes a user-specific operation of the operating element into consideration.

A first aspect of the invention involves a method for controlling an actuator connected to an operating element of a manual user interface and serves for the output of a haptic feedback signal $S_A(t)$ to a user via the operating element. A sensor is present in the operating element, the sensor detecting a sensor signal $S_S(t)$ generated by a manual input of the user as a reaction to the emitted feedback signal $S_A(t)$. The method comprises the following steps:

In one step, after output of a feedback signal $S_A(t_0)$ at a time $t_0$, a determination of a reaction time RZ of the user is carried out by the actuator on the basis of the sensor signal $S_S(t)$ for $t>t_0$, wherein, if the determined reaction time RZ is shorter than a predetermined limit value $G_{RZ}$, haptic feedback signals $S_A(t)$ to be emitted in the future are changed in such a way that their haptically perceptible (by a user) intensity is reduced, and, if the determined reaction time RZ is greater than a predetermined limit value $G_{RZ}$, haptic feedback signals $S_A(t)$ to be emitted in the future are changed in such a way that their haptically perceptible (by a user) intensity is increased.

In an alternative or additional step, after output of a feedback signal $S_A(t_0)$ at a time $t_0$, a determination of a maximum magnitude $|S_S(t)|_{max}$ of the sensor signal $S_S(t)$ is carried out by the actuator on the basis of the sensor signal $S_S(t)$ for $t>t_0$, wherein, if the determined maximum magnitude $|S_S(t)|_{max}$ is lower than a predetermined limit value $G_{Ssmax}$, haptic feedback signals $S_A(t)$ to be emitted in the future are changed in such a way that their haptically perceptible (by a user) intensity is reduced, and, if the determined maximum magnitude $|S_S(t)|_{max}$ is greater than a predetermined limit value $G_{Ssmax}$, haptic feedback signals $S_A(t)$ to be emitted in the future are changed in such a way that their haptically perceptible (by a user) intensity is increased.

The term "operating elements" is presently understood as being broadly defined. Such an operating element forms the interface that receives a manual input of a user and detects this as sensor signals $S_S(t)$ with the sensor. To do so, the sensor is suitably connected to the operating element. The manual input is advantageously generated by a force input, a moment input, or a pressure input of the user in or on the operating element. Touch-sensitive surface elements, such as known from touch pads, for example, buttons, switches, computer mice, joysticks, etc. fall under the term "operating element".

In general, all sensors that are implemented for the detection of a manual input can be considered, in particular force sensors, pressure sensors, moment sensors or a combination thereof. In the event of the manual input of a user on the operating element, the sensor detects time-dependent time signals $S_S(t)$. These sensor signals $S_S(t)$ preferably reproduce forces and/or moments and/or pressures that the user applies to the operating element during the input. In particular, the sensor signals $S_S(t)$ can be multi-dimensional, and thus specify multi-dimensional states of the operating element, for example positions, angles, speeds, accelerations of the operating element.

The term "actuator" is presently understood as being broadly defined. For example, electric motors, piezoelectric elements, voice coils, hub magnets, etc. fall under this. The actuator serves to generate a feedback signal $S_A(t)$ on the operating element that can be haptically perceived by the user. Advantageously, the feedback signal $S_A(t)$ can be predetermined or set in terms of its amplitude or its amplitude response, its frequency or its frequency response, its subsiding behavior. One or more temporally successive feedback signals $S_A(t)$ signalize to the user, for example, that the manual input carried out led to a change of the state of the operating element because of its input intensity and/or temporal length, for example the operating element adopted or generated a new switching state, and/or the feedback signals $S_A(t)$ facilitate the start and the end of a manual input into the operating element to the user.

The proposed method automatically adapts the haptic feedback signals $S_A(t)$ to input characteristics of the respective user, such that it is individually ensured for each user that he safely and reliably perceives emitted feedback signals $S_A(t_0)$.

Advantageously, the feedback signals $S_A(t)$ that are determined in such a way and are adapted to the respective user can be stored in a retrievable manner. Advantageously, a user interface, which has at least one such operating element, is initiated specifically for the respective user. Thus, it can be ensured that, if several users come into question for inputs into the operating element, the feedback signals $S_A(t)$ optimized for each user are emitted for them.

According to a first alternative of the method, this is achieved by a reaction time RZ of the user being determined after output of a feedback signal $S_A(t_0)$ at the time $t_0$ by the actuator on the basis of the detected sensor signal $S_S(t)$ for $t > t_0$. Advantageously, the reaction time RZ is determined starting from to in a predetermined time interval. To do so, the sensor signal $S_S(t)$ is advantageously analyzed for $t > t_0$. For example, the reaction time RZ can be the time that passes from the time $t_0$ to reaching a maximum or minimum of the sensor signal $S_S(t)$ for $t > t_0$. The criteria for determining the reaction time RZ can be chosen deviating therefrom, corresponding to the task. The reaction time RZ is hence the time that has passed since the output of the feedback signal $S_A(t_0)$ at the time $t_0$, until a reaction of the user triggered thereby is carried out, which can be recognized by means of the sensor signal $S_S(t)$ for $t > t_0$.

According to the definition of the reaction time RZ, a limit value $G_{RZ}$ is predetermined that advantageously defines a normal reaction time that can be expected. The limit value $G_{RZ}$ is correspondingly predetermined depending on the specification and task. Advantageously, the limit value $G_{RZ}$ is chosen from the range 20 to 60 ms or from the range 30 to 50 ms. If the determined reaction time RZ is shorter than the predetermined limit value $G_{RZ}$, then the haptically perceptible intensity of the emitted feedback signal $S_A(t)$ is selected too high, such that, in this case, haptic feedback signals $S_A(t)$ to be emitted in the future are automatically changed in such a way that their haptically perceptible intensity is reduced.

Whereas, if the determined reaction time RZ is greater than the predetermined limit value $G_{RZ}$, then it can be assumed from this that the feedback signal $S_A(t_0)$ was not perceived or not correctly perceived by the user. As a reaction, haptic feedback signals $S_A(t)$ to be emitted in the future are automatically changed in such a way that their haptically perceptible intensity is increased.

In a second alternative or in addition to the first alternative, a maximum magnitude $|S_S(t)|_{max}$ of the sensor signal $S_S(t)$ is determined after output of a feedback signal $S_A(t_0)$ at the time $t_0$ by the actuator on the basis of the sensor signal $S_S(t)$ for $t > t_0$. Advantageously, the maximum magnitude $|S_S(t)|_{max}$ is determined starting from to in a predetermined time interval. Furthermore, a limit value $G_{Ssmax}$ is predetermined that advantageously defines a normal maximum magnitude $|S_S(t)|_{max}$ of the sensor signal $S_S(t)$ that can be expected. The limit value $G_{Ssmax}$ is correspondingly predetermined depending on the specification and task.

If the determined maximum magnitude $|S_S(t)|_{max}$ is lower than the predetermined limit value $G_{Ssmax}$, then it can be assumed that the feedback signal $S_A(t_0)$ at the time $t_0$ was extraordinarily well perceived by the user. A haptic feedback signal $S_A(t)$ to be emitted in the future can thus be automatically changed in such a way that its haptically perceptible intensity is reduced in comparison to the previous feedback signal $S_A(t_0)$ at the time $t_0$. Whereas, if the determined maximum magnitude $|S_S(t)|_{max}$ is greater than the predetermined limit value $G_{Ssmax}$, then haptic feedback signals $S_A(t)$ to be emitted in the future are automatically changed in such a way that their haptically perceptible intensity is increased.

Advantageously, the haptic feedback signals $S_A(t)$ to be emitted in the future are correspondingly changed in a predetermined intensity step. The method is then advantageously carried out again in the event of an output of the changed feedback signal $S_A(t)$, such that a continuous optimization to the respective user takes place. Advantageously, a change of the feedback signal $S_A(t)$ is carried out depending on the detected sensor signal $S_S(t)$ for $t > t_0$ and/or a determined deviation of the reaction time RZ emerging from the sensor signal $S_S(t)$ for $t > t_0$ from the limit value $G_{RZ}$ and/or a determined deviation of the maximum magnitude $|S_S(t)|_{max}$ emerging from the sensor signal $S_S(t)$ for $t > t_0$ from the limit value $G_{Ssmax}$.

The haptically perceptible intensity of the haptic feedback signals to be emitted can be reduced or increased by various measures. For example, the feedback signal $S_A(t)$ can be changed in terms of its amplitude/its amplitude spectrum and/or its frequency/its frequency spectrum and/or its temporal increase or decrease behavior and/or its attenuation behavior.

If, in the event of an input of the user on the operating element, two or more temporally successive feedback signals $S_A(t)$ are emitted in order to thus signalize different switching states of the operating element to the user, the previously described method is advantageously implemented for each of the emitted feedback signals $S_A(t_{01})$, $S_A(t_{02})$, $S_A(t_{03})$ etc. Thus, by analyzing the sensor signals $S_S(t)$ following the respective feedback signals $S_A(t)$, two or more determined reaction times $RZ_{01}$, $RZ_{02}$, $RZ_{03}$ ... and two or more maximum magnitudes $|S_{S,01}(t)|_{max}$, $|S_{S,02}(t)|_{max}$, $|S_{S,03}(t)|_{max}$, ... emerge. Advantageously, the average of these is respectively taken and they are compared to the limit values $G_{RZ}$ or $G_{Ssmax}$. Based on this comparison, the haptic feedback signals to be emitted in the future are changed, so to speak, as described above. Alternatively to this, only the sensor signals $S_S(t)$ that are detected temporally after output of a feedback signal $S_A(t_{01})$, $S_A(t_{02})$, $S_A(t_{03})$, ... can also be analyzed as stated above, wherein all haptic feedback signals $S_A(t)$ to be emitted in the future can be changed based on this, as described above.

The proposed method is advantageously only implemented after the request of a user. This request can take place in a corresponding input interface as a result of a manual or acoustic input. In this case, the previously described adjustment of the feedback signals $S_A(t)$ is carried out after an explicit request of the respective user. Alternatively to this, the proposed method can take place automatically in the event of each manual input in the user interface.

A further aspect of the invention relates to a user interface comprising: an operating element for the manual input by a user, an actuator connected to the operating element for the output of a haptic feedback signal $S_A(t)$ to the user via the operating element, a sensor connected to the operating element, the sensor detecting a sensor signal $S_S(t)$ that is generated by a manual input of the user into the operating element as a reaction to the emitted feedback signal $S_A(t)$, and a control apparatus connected to the actuator and the sensor.

The control apparatus is implemented and set up in such a way that, after output of a feedback signal $S_A(t_0)$ at a time $t_0$, a reaction time RZ of the user is determined on the basis of the sensor signal $S_S(t)$ for $t > t_0$, wherein, if the determined reaction time RZ is shorter than a predetermined limit value $G_{RZ}$, haptic feedback signals $S_A(t)$ to be emitted in the future are changed in such a way that their haptically perceptible (by a user) intensity is reduced, and, if the determined reaction time RZ is greater than a predetermined limit value $G_{RZ}$, haptic feedback signals $S_A(t)$ to be emitted in the future are changed in such a way that their haptically perceptible (by a user) intensity is increased, and/or after output of a feedback signal $S_A(t_0)$ at a time $t_0$, a maximum magnitude $|S_S(t)|_{max}$ of the sensor signal $S_S(t)$ is determined on the basis of the sensor signal $S_S(t)$ for $t > t_0$, wherein, if the determined maximum magnitude $|S_S(t)|_{max}$ is lower than a predetermined limit value $G_{Ssmax}$, haptic feedback signals $S_A(t)$ to be emitted in the future are changed in such a way that their haptically perceptible (by a user) intensity is reduced, and, if the determined maximum magnitude $|S_S(t)|_{max}$ is greater than a predetermined limit value $G_{Ssmax}$, haptic feedback signals $S_A(t)$ to be emitted in the future are changed in such a way that their haptically perceptible (by a user) intensity is increased. The control apparatus advantageously comprises a processor and a storage unit.

Advantages and preferred developments of the proposed user interface emerge by the corresponding and analogous transferral of the embodiments produced in conjunction with the proposed method.

A further aspect of the invention relates to a vehicle having a user interface, as described above.

BRIEF DESCRIPTION OF THE DRAWING FIGURES

Further advantages, features and details arise from the following description in which at least one exemplary embodiment is described in detail, if applicable with reference to the drawing. The same, similar and/or functionally identical parts are referred to with the same reference numerals.

Figure 2:
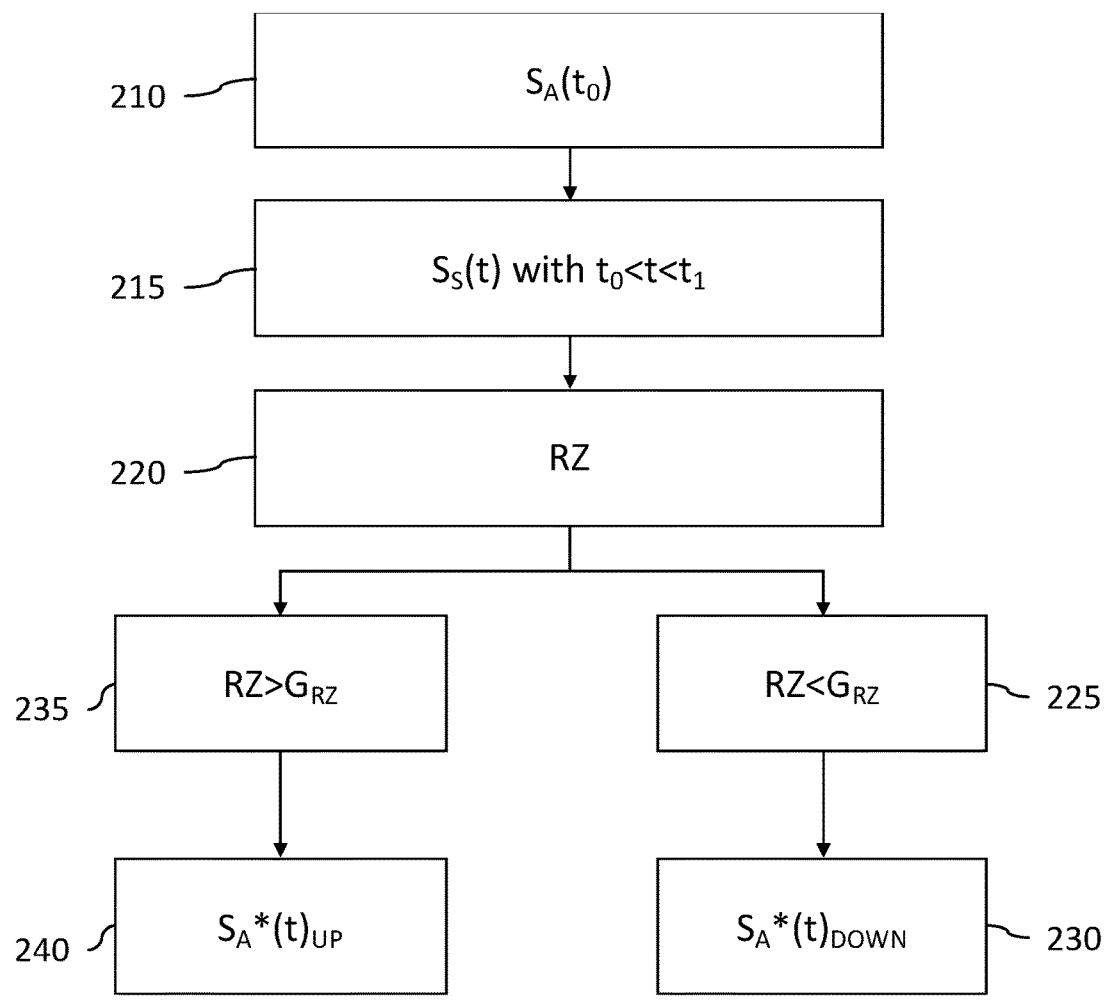

Here are shown:

FIG. 1 a schematic depiction of a user interface 200 according to the invention, and FIG. 2 a schematic depiction of a proposed method.

DETAILED DESCRIPTION

FIG. 1 shows a schematic depiction of a user interface 200 according to the invention. The user interface 200 comprises an operating element 201 formed as a carrier plate for the manual input of a user. Presently, the user touches the surface of the operating element 201, from above in the drawing, and introduces a force directed downwards in the drawing (represented by the arrow) into the operating element 201. An actuator 202, for example having a voice coil or a piezoelectric element (not depicted) is connected to the operating element 201, by means of which actuator 202 a feedback signal $S_A(t)$ that can be haptically perceived by the user can be emitted to him via the operating element 201. The feedback signal $S_A(t)$ presently has a predetermined frequency spectrum, a predetermined amplitude time period, predetermined increase and decrease behavior. The feedback signal $S_A(t)$ controls the actuator 202 and is converted by the actuator 202 into mechanical movements that can be haptically perceived by the user.

Furthermore, the operating element 202 is connected to a sensor 203 that detects a sensor signal $S_S(t)$ generated by a manual input of the user into the operating element 201, in particular in reaction to the emitted feedback signal $S_A(t)$. Presently, the sensor 203 is advantageously a force sensor. Particularly advantageously, the sensor 203 is presently implemented identically to the actuator 202, i.e., as a voice coil unit.

The user interface 200 further comprises a control apparatus 204 connected to the actuator 202 and the sensor 203. This control apparatus 204 is implemented and configured in such a way that, after output of a feedback signal $S_A(t_0)$ at a time $t_0$, a reaction time RZ of the user is determined on the basis of the sensor signal $S_S(t)$ for $t > t_0$, wherein, if the determined reaction time RZ is shorter than a predetermined limit value $G_{RZ}$, haptic feedback signals $S_A(t)$ to be emitted in the future are changed in such a way that their haptically perceptible intensity is reduced, and, if the determined reaction time RZ is greater than a predetermined limit value $G_{RZ}$, haptic feedback signals $S_A(t)$ to be emitted in the future are changed in such a way that their haptically perceptible intensity is increased.

Presently, this is carried out by increasing the amplitude and the frequency response of the feedback signal $S_A(t)$.

FIG. 2 shows a schematic depiction of a proposed method for controlling an actuator 202 that is connected to an operating element 201 of a manual user interface 200 and serves for the output of a haptic feedback signal $S_A(t)$ to a user via the operating element 201, wherein a sensor 203 is present in the operating element 201, the sensor 203 detecting a sensor signal $S_S(t)$ that is generated by a manual input of the user as a reaction to the emitted feedback signal $S_A(t)$.

Presently, the method is started by a corresponding input of the user. All further steps of the method are automatically implemented.

Initially, at a time $t_0$, a feedback signal $S_A(t_0)$ is emitted to the user by means of the actuator 202 via the operating element 201 (step 210). Then, sensor signals $S_S(t)$ are detected by the sensor 203 for $t_0 < t < t_1$, the sensor signals $S_S(t)$ being generated by a manual input of the user into the operating element as a reaction to the emitted feedback signal $S_A(t_0)$ (step 215). The time point $t_1$ is correspondingly predetermined. In a further step, a reaction time RZ of the user is determined on the basis of the sensor signal $S_S(t)$ $t_0 < t < t_1$ (step 220). Presently, this is carried out by the determination of the period of time between the time $t_0$ and the time at which the magnitude of the sensor signal $S_S(t)$ within the time interval $[t_0, t_1]$ is a maximum.

Then, the reaction time RZ is compared to a predetermined limit value $G_{RZ}$. If the determined reaction time RZ is shorter than the predetermined limit value $G_{RZ}$ (step 225), haptic feedback signals $S_A*(t)_{DOWN}$ that are to be emitted in the future are changed such that their haptically perceptible intensity is reduced (step 230), and if the determined reaction time RZ is higher than the predetermined limit value $G_{RZ}$ (step 235), haptic feedback signals $S_A*(t)_{UP}$ that are to be emitted in the future are changed such that their haptically perceptible intensity is increased (step 240).

If the determined reaction time RZ is the same as the limit value $G_{RZ}$, the feedback signal is not changed for future outputs.

Advantageously, the feedback signal $S_A*(t)$ correspondingly changed for the respective user is stored belonging to the user.

Although the invention has been illustrated and explained in more detail by preferred exemplary embodiments in detail, the invention is not limited by the examples disclosed, and other variations can be derived from this by the person skilled in the art without leaving the protected scope of the invention. It is therefore clear that there is a plurality of possible variations. It is also clear that embodiments stated by way of example are only really examples which are not to be seen as limiting the scope, application possibilities or configuration of the invention in any way. Rather, the preceding description and the description of the figures put the person skilled in the art in a position to concretely implement the exemplary embodiments, wherein the person skilled in the art with knowledge of the disclosed inventive ideas can carry out diverse changes, for example in terms of the function or the arrangement of individual elements mentioned in an exemplary embodiment, without leaving the scope of protection that is defined by the claims and their legal equivalents, such as further explanations in the description, for example.

The invention claimed is:

1. A method for controlling an actuator connected to an operating element of a manual user interface, the method comprising:
    outputting, by the actuator via the operating element, a haptic feedback signal;
    detecting, by a sensor of the operating element, a sensor signal generated by a manual input of a user responsive to the haptic feedback signal;
    determining, based on the detected sensor signal,
        a reaction time of the user after output of the haptic feedback signal by the actuator and adjusting
            responsive to the determined reaction time being shorter than a first predetermined limit value, future haptic feedback signals in such a way that a haptically perceptible intensity of the future haptic feedback signals is reduced;
            responsive to the determined reaction time being greater than the first predetermined limit value, the future haptic feedback signals in such a way that the haptically perceptible intensity of the future haptic feedback signals is increased; or
        a maximum signal magnitude of the sensor signal after output of the feedback signal by the actuator and adjusting
            responsive to the determined maximum magnitude being lower than a second predetermined limit value, the future haptic feedback signals in such a way that the haptically perceptible intensity of the future haptic feedback signals is reduced; and
            responsive to the determined maximum magnitude being greater than the second predetermined limit value, the future haptic feedback signals in such a way that the haptically perceptible intensity of the future haptic feedback signals is increased.

2. The method of claim 1, wherein the increase or reduction of haptically perceptible intensity of the future haptic feedback signals involves a change of amplitude, frequency, or attenuation of the future haptic feedback signals.

3. The method of claim 1, wherein the actuator comprises a voice coil or a piezoelectric element.

4. The method of claim 1, wherein the first predetermined limit value is between 30 to 50 ms.

5. The method of claim 1, wherein the method is automatically performed independent of a user input.

6. The method of claim 1, wherein the method is automatically performed only after a user input at a start of the method.

7. A user interface (200), comprising:
    an operating element configured for manual input by a user;
    an actuator, connected to the operating element, configured to output of a haptic feedback signal to the user via the operating element;
    a sensor, connected to the operating element, configured to detect a sensor signal generated by a manual input of the user into the operating element (201) in response to the outputted haptic feedback signal; and
    a controller, connected to the actuator and the sensor, configured to determine, based on the detected sensor signal,
        a reaction time of the user after output of the haptic feedback signal by the actuator, wherein the controller is further configured to adjust
            responsive to the determined reaction time being shorter than a first predetermined limit value, future haptic feedback signals in such a way that a haptically perceptible intensity of the future haptic feedback signals is reduced;
            responsive to the determined reaction time being greater than the first predetermined limit value, the future haptic feedback signals in such a way that the haptically perceptible intensity of the future haptic feedback signals is increased; or
        a maximum signal magnitude of the sensor signal after output of the feedback signal by the actuator, wherein the controller is further configured to adjust
            responsive to the determined maximum magnitude being lower than a second predetermined limit value, the future haptic feedback signals in such a way that the haptically perceptible intensity of the future haptic feedback signals is reduced; and
            responsive to the determined maximum magnitude being greater than the second predetermined limit value, the future haptic feedback signals in such a way that the haptically perceptible intensity of the future haptic feedback signals is increased.

8. The user interface of claim 7, wherein the increase or reduction of haptically perceptible intensity of the future haptic feedback signals involves a change of amplitude, frequency, or attenuation of the future haptic feedback signals.

9. The user interface of claim 7, wherein the actuator comprises a voice coil or a piezoelectric element.

10. A vehicle, comprising:
    an operating element configured for manual input by a user;

an actuator, connected to the operating element, configured to output of a haptic feedback signal to the user via the operating element;

a sensor, connected to the operating element, configured to detect a sensor signal generated by a manual input of the user into the operating element (201) in response to the outputted haptic feedback signal; and a controller, connected to the actuator and the sensor, configured to determine, based on the detected sensor signal, a reaction time of the user after output of the haptic feedback signal by the actuator, wherein the controller is further configured to adjust responsive to the determined reaction time being shorter than a first predetermined limit value, future haptic feedback signals in such a way that a haptically perceptible intensity of the future haptic feedback signals is reduced;

responsive to the determined reaction time being greater than the first predetermined limit value, the future haptic feedback signals in such a way that the haptically perceptible intensity of the future haptic feedback signals is increased; or a maximum signal magnitude of the sensor signal after output of the feedback signal by the actuator, wherein the controller is further configured to adjust responsive to the determined maximum magnitude being lower than a second predetermined limit value, the future haptic feedback signals in such a way that the haptically perceptible intensity of the future haptic feedback signals is reduced; and responsive to the determined maximum magnitude being greater than the second predetermined limit value, the future haptic feedback signals in such a way that the haptically perceptible intensity of the future haptic feedback signals is increased.

* * * * *